United States Patent [19]

Beam

[11] 3,988,166
[45] Oct. 26, 1976

[54] APPARATUS FOR ENHANCING THE OUTPUT OF PHOTOVOLTAIC SOLAR CELLS

[75] Inventor: Benjamin H. Beam, Sunnyvale, Calif.

[73] Assignee: Beam Engineering, Inc., Sunnyvale, Calif.

[22] Filed: Jan. 7, 1975

[21] Appl. No.: 539,065

[52] U.S. Cl. ................................ 136/89; 126/271
[51] Int. Cl.² ...................... H01L 31/04; F24J 3/02
[58] Field of Search ............... 136/89; 126/270, 271

[56] References Cited
UNITED STATES PATENTS

| | | | |
|---|---|---|---|
| 1,289,369 | 12/1918 | Berglund | 136/89 |
| 2,402,662 | 6/1946 | Ohl | 136/89 |
| 2,888,007 | 5/1959 | Tabor | 126/270 |
| 2,946,945 | 7/1960 | Regnier et al. | 136/89 |
| 2,985,783 | 5/1961 | Garbuny et al. | 313/65 |
| 3,171,403 | 3/1965 | Drescher | 126/270 |

OTHER PUBLICATIONS

C. Pfeiffer et al., "Performance of Silicon Solar Cells at High Levels of Solar Radiation," *Journal of Eng. for Power*, Jan. 1962, pp. 33–38.

E. L. Ralph, "Use of Concentrated Sunlight with Solar Cells for Terrestrial Applications," *Solar Energy*, vol. 10, No. 2, pp. 67–71.

W. A. Beckman et al., "Design Considerations for a 50 Watt Photovoltaic Power System Using Concentrated Solar Energy," *Solar Energy*, vol. 10, No. 3, 1966, pp. 132–136.

*Primary Examiner*—John H. Mack
*Assistant Examiner*—Aaron Weisstuch
*Attorney, Agent, or Firm*—Thomas H. Olson

[57] ABSTRACT

An array of photovoltaic cells and a parabolic concentrator for concentrating solar energy onto the cells. A watertight chamber including a solar energy pervious window adjacent the focus of the parabolic concentrator. The solar cell array is disposed within the chamber in alignment with the window. A quantity of water disposed in the chamber, the quantity being sufficient to absorb heat energy so as to limit the temperature rise of the solar cell array during periods of solar energy impingement thereon. The watertight chamber has sufficient external surface area that the heat energy stored therein is transferred away during non-solar energy producing periods of the diurnal cycle.

2 Claims, 6 Drawing Figures

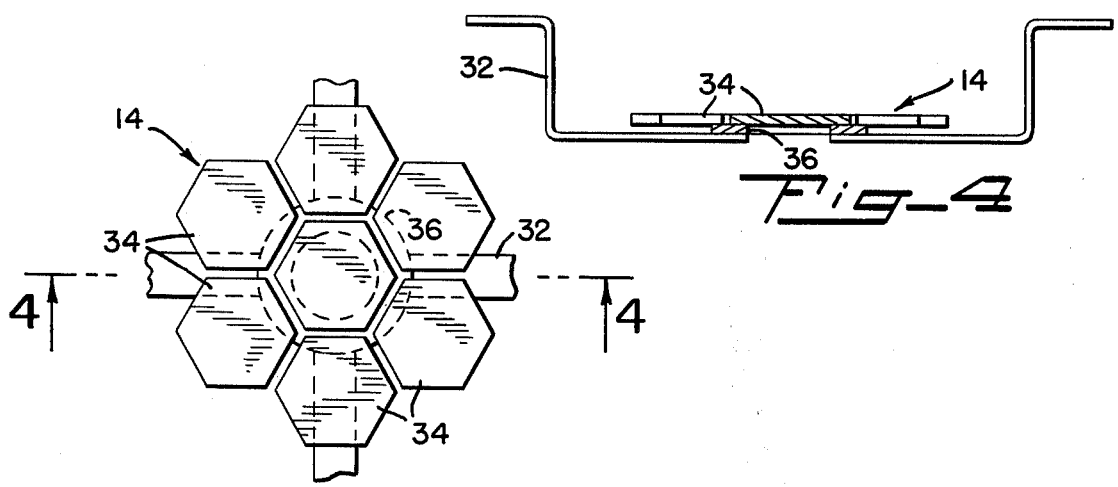
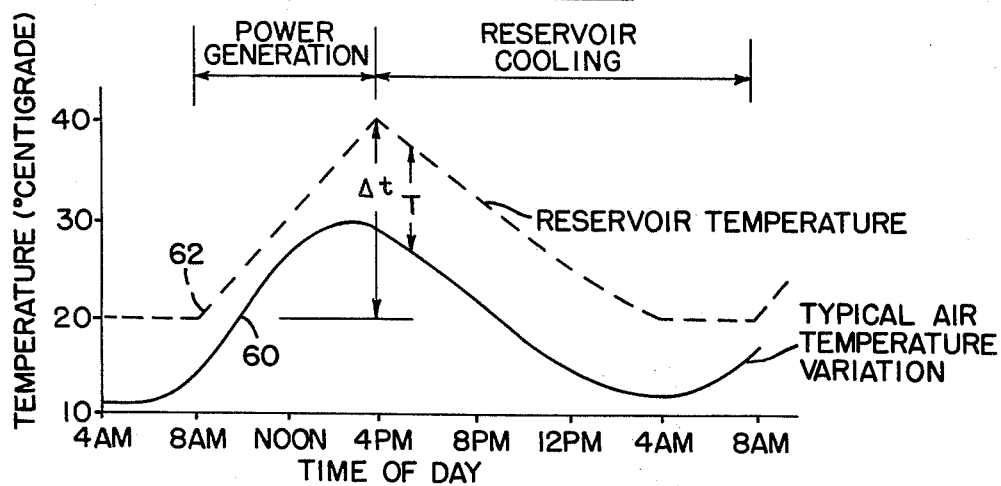
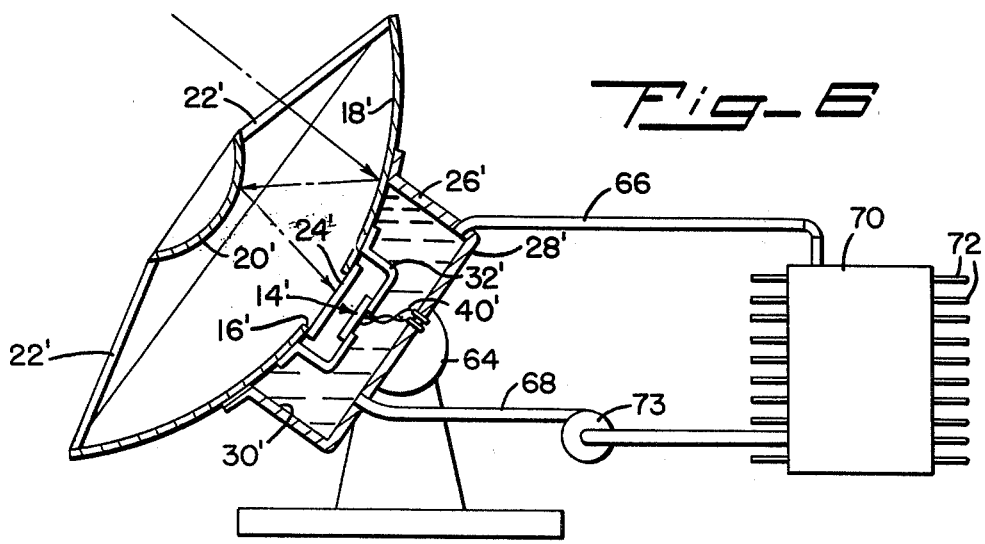

3,988,166

APPARATUS FOR ENHANCING THE OUTPUT OF PHOTOVOLTAIC SOLAR CELLS

BACKGROUND OF THE INVENTION

1. Field of the Invention:

This invention relates to generation of electrical energy from solar cells and more particularly to a method and apparatus for enhancing the efficiency of energy production to render solar cells competitive with more conventional sources of power.

2. Description of the Prior Art:

In an article titled "Design Considerations for a 50-watt Photovoltaic Power System Using Concentrated Solar Energy" by Beckman et al., published in Solar Energy, Volume 10, No. 3, 1966 at Page 132 et seq., there is disclosed a solar cell array on which solar energy is concentrated and wherein the cells are supported on a cooling unit which is part of a forced flow water system that has a heat exchanger remote from the solar cells. The device disclosed in the article operates by transferring heat out of the system simultaneously with the heat input from the solar energy collector and thus requires substantial pumping and heat exchanging capacity.

An article titled "Performance of Silicon Solar Cells at High Levels of Solar Radiation" by Pfeiffer et al., Transactions of the ASME, January, 1962, Page 33 et seq., describes an experiment in which solar cells are placed in a waterproof capsule that has a mylar window through which solar energy is introduced. The water is circulated through the system at a substantial rate to maintain a relatively low cell temperature.

An article titled "Use of Concentrated Sunlight with Solar Cells for Terrestrial Applications" by Ralph, Solar Energy, Volume 10, No. 2, 1966 Page 67 et seq., discloses a solar concentrator for solar cells operating without auxilliary cooling equipment to offset temperature rise in the solar cells. He states that "Forced-air or water-cooling equipment could be used to offset this temperature rise; however, such equipment is costly, complicated, and would consume power, . . ."

The following U.S. Pat. together with other Patents in Class 136–89 disclose solar energy concentrators: Nos. 588,177; 3,232,795; 3,279,457; 3,350,234; 3,376,165; 3,419,434; and 3,427,200.

SUMMARY OF THE INVENTION

Contrary to known prior art procedures for enhancing the efficiency or power output of solar cells, the present invention employs a substantial quantity of heat absorbing material, such as water, to absorb heat energy during the 8 hours or so of intense solar energy in order to limit the temperature rise of the solar cells. The stored heat energy is then transferred from the heat energy absorbing medium during the balance of the diurnal period. Accordingly, the first cost and recurring operating cost of the equipment are minimized so that improved efficiencies are achieveable. Efficiencies can be improved to a degree that solar cells used in the apparatus and method of the present invention can compete with other sources of electrical power.

An object of the invention is to provide an improved solar photovoltaic power supply which concentrates sunlight on a solar cell array to increase the power output of the array while maintaining the cells at a relatively low temperature for high conversion efficiency. This object is achieved by operating the cells in a quantity of heat absorbing medium, such as water, which quantity is large enough to absorb sufficient heat energy to limit the temperature rise during daylight hours. During the balance of the diurnal cycle when there is no sunlight, the heat energy is transferred to the relatively colder environment so as to operate the cells at high efficiency without expending power for pumping the medium through a conventional heat exchange system.

Another object is to provide a very economical source of electric power by increasing the power that a solar cell array can produce by orders of magnitude, thus reducing the cost of power so produced to a point where it becomes competitive with other sources of energy. This object is achieved in part because the heat energy absorbing medium, water, is universally available and is exploited in a relatively simple inexpensive structure provided according to the invention.

A futher object is to provide improved efficiency of power generation from solar cells by providing a system that exploits temperature conditions throughout the diurnal cycle so that heat is absorbed in the medium during daylight hours and is released more efficiently during cooler periods in the diurnal cycle.

Still another object of the invention is to provide an improved solar photovoltaic power supply which can operate without attention and which requires only occasional maintenance such as cleaning of the reflective surface. The present invention achieves this object by providing apparatus that has a minimum number of moving parts so that breakdowns due to wear are minimized or eliminated.

Yet another object of the invention is to provide a method for operating a solar cell which method continues throughout the diurnal cycle. Performance of the method permits elimination or reduction of power consuming and wear producing parts and mechanisms.

The foregoing together with other objects, features and advantages will be more apparent after referring to the following specification and the accompanying drawings.

BRIEF DESCRIPTION OF THE DRAWINGS

FIG. 3 is a view at enlarged scale of the solar cell array in the apparatus in FIG. 2.

FIG. 4 is a cross sectional view taken along line 4—4 of FIG. 3.

FIG. 5 is a plot of temperature versus time of day for illustrating an important characteristic of apparatus according to the invention.

FIG. 6 is a cross sectional elevation view of an alternate embodiment of the present invention.

DESCRIPTION OF THE PREFERRED EMBODIMENT

Figure 1:
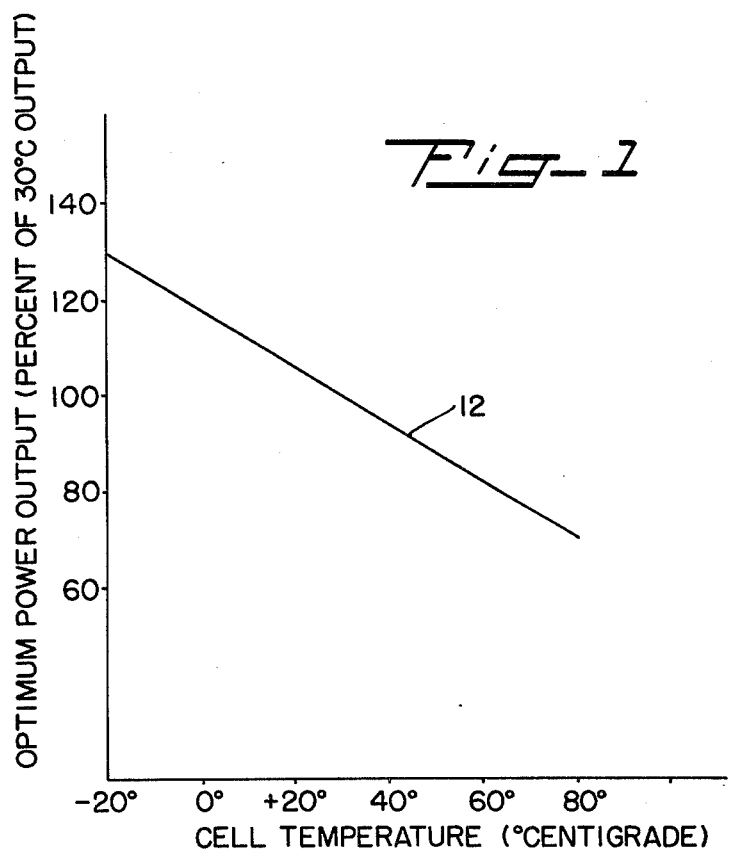
FIG. 1 is a plot of cell temperature versus power output for a typical solar cell.

Referring more particularly to drawings reference numeral 12 indicates the power output of a commercially available solar cell in the temperature range of −20° C to +80° C, temperature being plotted on the abscissa. For the purposes of illustration, 100% output is assumed to occur at 30° C, the output being plotted on the ordinate. As can be seen from curve 12 in FIG. 1, the output of the solar cell decreases substantially as the temperature of the cell increases, a phenomenon well known to those skilled in the art. Concentrating solar energy on a solar cell increases the output of the solar cell but at the same time raises the temperature of the solar cell so that the efficiency of power output, without providing for cooling of the cell, is substantially reduced. The present invention achieves both solar concentration and limitation of temperature rise so as to enhance substantially the output of the solar cell.

Figure 2:
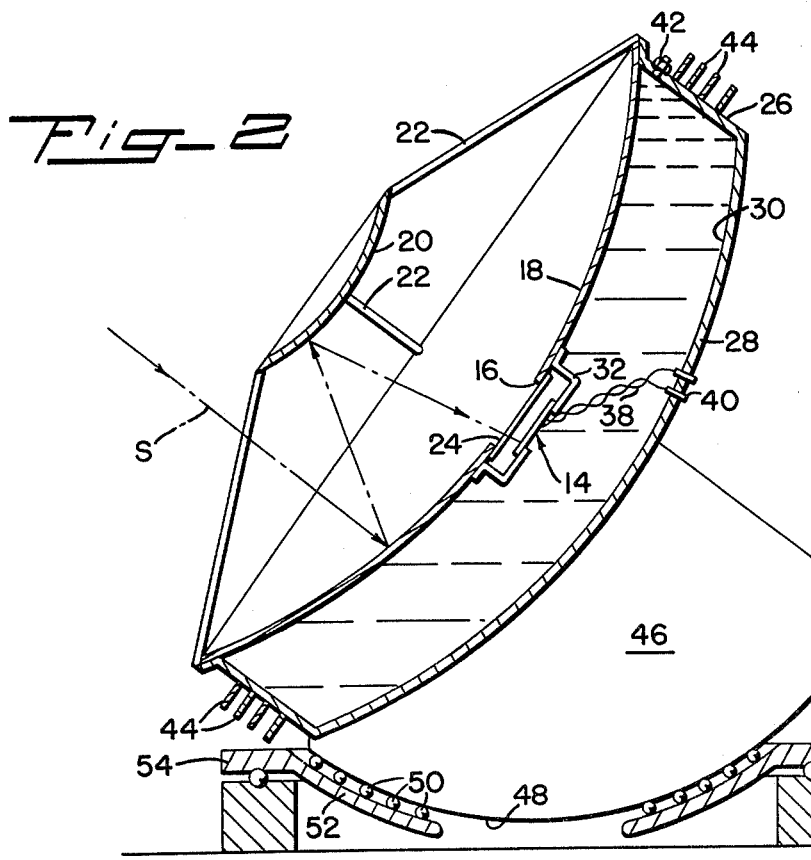
FIG. 2 is a cross sectional elevation view of an apparatus designed according to the present invention.

Referring to FIG. 2, a solar cell array identified generally at 14 is mounted in alignment with an opening 16 formed in a parabolic reflector wall 18 which constitutes a part of a Cassegrain concentrating system. The system also includes a secondary hyperbolic reflector 20 which is supported in fixed space relation to parabolic reflector wall 18 by radially extending struts 22. The Cassegrain concentrator, which is disclosed in the U.S. Pat. No. 2,985,783, for example, is not per se a part of the invention and exemplifies any suitable structure for concentrating solar energy onto a relatively small area. Suffice it to say, solar energy traversing a path S is reflected by the concave surface of parabolic wall 18 to the convex surface of reflector 20 and thence through opening 16 to the solar cell array 14.

Spanning opening 16 in parabolic wall 18 is a window 24 that can be glass, Plexiglass or like material that is solar energy previous - liquid impervious. At the periphery of parabolic wall 18 and rearward of the reflective surface thereof is an impervious cylindric wall 26. The cylindric wall terminates rearward of wall 18 where it is spanned by an impervious rear wall 28 so as to form a watertight reservoir 30. The reservoir is bounded by parabolic wall 18, window 24, cylindric wall 26 and rear wall 28. In the embodiment of FIG. 2, rear wall 28 is of parabolic shape; such shape improves the balance or symmetry of the structure but is not critical.

Solar array 14 is supported within chamber 30 by means of brackets 32; the solar cell array is supported in alignment with window 24 and spaced therefrom so that the image of the solar rays emanating from secondary reflector 20 is focused on the array.

Solar cell array 14 can be formed, for example, of seven identical solar cells 34 which as shown in FIG. 3 are hexagonal shaped so as to afford closely spaced mounting thereof. The solar cells are preferably about 2 inches in maximum dimension to facilitate construction of the same from a standard two inch boule of crystal material. The shape of the cells and their number is not critical, but will be determined from cost and convenience. The cells will have conducting grids on their active surfaces, which is known to present art and practice, but which is especially important in this device to minimize series resistance at high currents which would reduce efficiency. The spacing between the solar cell array and the window is approximately ⅛ inch to 1 inch to allow circulation of the coolant medium but to avoid substantial absorption of the solar radiation by the coolant medium. The solar cells are adhesively secured to an insulative ring 36 which is supported at the inner ends of brackets 32. The solar cells are connected in series, by conductors not shown, and because each solar cell produces an output voltage of about 0.4 volts, the voltage output of the series combination in the example considered is about 2.8 volts. The output voltage of the series combination is connected via conductors 38 to a pair of output terminals 40 which extend through wall 28 in a watertight mount of conventional form.

There is an inlet opening to reservoir 30 such as a valved opening 42 in cylindric wall 26. Valved opening 42 permits reservoir 30 to be filled with a suitable non-conductive heat absorbing medium such as water. As will be discussed in more detail hereinbelow, the volume of reservoir 30 is sufficient that the temperature rise of the heat absorbing medium and of solar cells 34 is confined within a range of efficient operation of the cells. For more efficiently transferring the heat energy stored in the medium in chamber 30 there is a plurality of radially extending cooling fins 44 mounted on the exterior of cylindric wall 26.

A support structure 46 is secured to rear wall 28. Support structure 46 has a lower arcuate surface 48 which forms one race of a bearing having rollers, schematically shown at 50, and a lower race 52. Lower race 52 is rigid with an azimuth ring 54, the lower surface of which forms a race for a bearing that includes balls 56 and a rigid base ring 58. Conventional means schematically shown at 59E and 59A are provided for positioning the elevation and azimuth of the structure so that it is pointed toward the sun during daylight periods in order that solar energy is maximally concentrated through window 24 onto solar cell array 14.

In order to achieve the high efficiency afforded by the present invention, reservoir 30 is of a size to contain a quantity of heat absorbing medium sufficient to absorb heat energy produced during the solar energy producing portion of the diurnal period and to limit the temperature rise of solar cells 34. The heat energy absorbed by the medium is transferred to the atmosphere at a more advantageous time i.e. during a portion of the diurnal period when no sunlight is present and consequently when the temperature of the environment is lower. Referring to FIG. 5, wherein the time during a diurnal period is plotted on the abscissa and the ambient temperature in degrees centigrade is plotted on the ordinate, curve 60 indicates the air temperature variation in a typical environment. In the example plotted in FIG. 5, the temperature varies from a high of about 30° C to a low of about 11° C. The temperature of the medium in reservoir 30 is indicated by curve 62 in FIG. 5 and is assumed to be T° above the air temperature. The difference between the maximum heat energy absorbing medium temperature and the minimum temperature is identified in FIG. 5 as $\Delta t$. Employing known principles of thermodynamics the following formula is derived:

$$\Delta t = \frac{E}{n_p n_c C W J},$$

wherein $E$ is the electrical energy produced by the cell (kilowatt hours), $\Delta t$ is the increment of temperature rise of the water coolant and the cells above the starting temperature (° C), $n_p$ is the electrical conversion efficiency of the solar cell, $n_c$ is the optical conversion efficiency of the concentrator system which focuses sunlight on the cell, $C$ is the heat capacity of the water (in kilocalories per kilogram ° C= calories per gram ° C), $J$ is the mechanical equivalent of heat (kilowatt hours per kilocalorie), and W is the weight of coolant in kilograms. Solving the above equation for $W$ produces the following:

$$W = \frac{E}{n_p n_c C \Delta t},$$

$W$ indicating the weight of water that will absorb sufficient heat energy to limit $\Delta t$ to a prescribed amount. In one structure designed to practice the present invention, the parameters of the above equation have magnitudes listed below:

$E = (0.14 \text{ kw}) (8 \text{ hrs}) = 1.12 \text{ kwhrs}$
$n_p = 10\% = .1$
$n_c = 50\% = .5$
$C = 1$ kcal/kgm for water
$\Delta t = 20°$ C
$J = 4.186$ Joules/cal
  $= 1.163 \times 10^{-3}$ kwhrs/kcal Solving the above equation for $W$ produces $W=963$ kilograms or 2,119 pounds of water. With such quantity of water in the example represented in FIGS. 1–5 the maximum temperature of the solar cells 34 is 40°, a temperature at which the efficiency of the cells is in excess of 90%.

At the termination of the solar energy producing portion of the diurnal period, assumed to occur around 4:00 p.m. in the example of FIG. 5, the air temperature begins to decrease. At a rate depending on the exterior surface area of the walls defining reservoir 30, the temperature of the medium correspondingly decreases so that by the time solar energy commences again, the temperature of the heat energy absorbing medium is lowered whereby another cycle of efficient operation can be acheived. Of course it will be obvious from the foregoing that the cooling of the medium occurs without the expenditure of power since the cooling is deferred until the non-solar energy producing portion of the diurnal period.

The area of the walls of the chamber together with the area of fins 44 to achieve the mode of operation shown in FIG. 5 can be derived from the following equation and the following parameters.

$$A = \frac{wc\frac{dt}{dt}}{K}$$

$= \frac{(963)(1)(1.25)}{(1.62)(20)^{5/4}} = 17.6 \text{m}^2$ $A$ = Total surface area of reservoir
$W$ = 963 kilograms
$C$ = 1 kcal/kilogram
$\frac{dT}{dt} = \frac{20° C}{16 \text{ hrs}} = 1.25°$/hr
$T = 20°$ C
$k = 1.62 \ T^{1/4}$kcal/square meter-° C-hour In one structure of the form shown in FIG. 2 and designed according to the present invention, the diameter of cylindric wall 26 is about 6½ feet, the depth about 1 foot, with 12 fins 3 inches wide around the circumference, a size sufficient to afford a 17.6 square meter area for transferring heat. The value of k used in the example is an average figure appropriate to this example, but varies somewhat for different surface orientations.

The operation of the apparatus of FIG. 2 will now be summarized in conjunction with graphs of FIGS. 1 and 5. After the structure shown in FIG. 2 is installed at a suitable site, reservoir 30 is filled with water through valved opening 42. Thereafter the structure is caused to follow the sun during the portion of the diurnal period when the sun is visible. Movement on the bearing structure together with the reflector composed of parabolic surface 18 and parabolic surface 20 assure impingement of the maximum amount of solar energy through window 24 onto solar cell array 14. The power required for positioning means 59A and 59E is taken from the solar cells, but is only about one-thousandth horsepowers because the structure is well balanced and the bearings are designed to afford minimal friction. As the temperature of the solar cells 34 in array 14 rises, there is a corresponding rise in temperature of the water in reservoir 30. Because the solar cell array is spaced from window 24, water entirely surrounds the array. The local high temperature region in reservoir 30 induces circulation within the reservoir so that the medium, i.e. water, within the reservoir is uniformly heated. Because of the large quantity of the medium the temperature rise is limited to about 20° C so that the efficiency of the solar cells is maintained. The electric power output on terminals 40 can be connected to load and/or to storage batteries as is desired. Because of the substantial quantity of water within reservoir 30 and the fact that the water circulates without energy consumption, maximization of the power output is achieved.

At the end of the solar energy producing portion of the diurnal period, the ambient temperature begins to decrease as shown in FIG. 5. Because of the substantial surface area of the walls of reservoir 30 and fins 44 the heat energy stored in the medium within the reservoir is transferred to the surrounding air so that when the next solar energy producing portion of the diurnal cycle occurs, the solar cells are at a relatively low temperature for efficient energy generation. Because of the great quantity of water in the reservoir, the normal cooling during dark portions of the diurnal cycle is exploited to achieve maximum utilization of the energy produced by the solar cells.

An alternate form of the apparatus of the invention is shown in FIG. 6. Because the embodiment in FIG. 6 has many elements corresponding in structure and function to the elements of the embodiment in FIG. 2, the same reference numerals with the addition of a prime are in part employed in FIG. 6. That is to say, there is a main parabolic wall 18' and a secondary parabolic reflector 20' supported in spaced relation to the main wall by struts 22'. Centrally of parabolic wall 18' is an opening 16' in which is mounted a solar energy pervious window 24'. Supported behind window 24' by brackets 32' is a solar cell array 14' which is substantially identical to array 14 described in more detail in reference to FIGS. 3 and 4. Behind parabolic wall 18' and surrounding photo cell array 14' is a reservoir defined by a cylindric wall 26' and a rear wall 28'. Conductors from the photo cell array extend through rear wall 28' at a waterproof joint to output terminals 40' to afford electrical connection with external circuitry.

The volume of reservoir 30' is substantially less than reservoir 30 in FIG. 2 in consequence of which the structure of FIG. 6, even when filled with water is lighter weight. Accordingly a more simplified base 64 is provided for supporting the structure. Base 64 includes suitable means for maintaining the concentrator pointed at the sun during solar energy producing portions of the diurnal period. Communicating with reservoir 30' is an outlet hose 66 and an inlet hose 68. The hoses communicate with a storage chamber 70, which has fins 72 on the exterior thereof, and in order to distribute the absorbed heat energy throughout the quantity of water contained in reservoir 30' and chamber 70, there is a low power circulator 73. The combined volume of reservoir 30' and chamber 70 is the same as the volume of reservoir 30 described hereinabove. Consequently, there is a sufficient quantity of heat energy absorbing medium to absorb the heat generated during the solar energy producing portion of the diurnal period to limit the temperature rise of solar cells. Circulator 73, because it only circulates the water to achieve temperature equilibrium within reservoir 30' and chamber 70 consumes very little power as compared with the power required to drive the high speed pump employed in the Beckman publication cited hereinabove. Moreover, because the weight of the water in reservoir 30' is less than the weight of the water in reservoir 30, the positioning apparatus in base 64 of the embodiment of FIG. 6 consumes less power so that the system of FIG. 6 affords substantially the same efficiency as the system of FIG. 2.

The operation of the embodiment of FIG. 6 is substantially identical to that referred to above. As the structure tracks the sun, energy is produced by the solar cells and the temperature rise of the solar cells is limited to about 20° C because of the heat energy absorbed in the water disposed in reservoir 30' and chamber 70. Circulator 73 slowly moves the water through the system so that the heat energy absorbed in the relatively warm water in reservoir 30' is distributed to the water in chamber 70. After termination of the portion of the diurnal period during which solar energy is produced, the absorbed heat is transferred to the relatively cooler atmosphere, fins 72 contributing to such cooling. In addition, the exterior surface areas of reservoir 30'' contribute to heat energy transfer.

Thus it will be seen that the present invention provides an apparatus for producing electric power which is efficient and inexpensive in that it employs a few solar cells with concentrated energy directed thereon and which consumes little or no power for limiting the temperature rise of the cells. Because the method is operative throughout the entire diurnal period, the normal atmosphere cooling during nightime is exploited to optimize energy generation. Moreover, because the apparatus is designed to employ water as the heat energy absorbing medium, the apparatus is relatively light in weight during transport and installation at a site. When installation has been completed, water from a local source is supplied to the system and operation proceeds as described above.

To underscore the important advance represented by the present invention it is pointed out that, based on costs applicable at the time of filing the application, for a plurality of systems that will supply 1 kilowatt continuous is about $2,500 to $3,000; this amount is approximately equal to the capitalized cost that public utilities require to deliver energy to a home. As a basis of comparison with current art in photovoltaic power supplies, the previously cited Ralph reference quotes $20 per watt or more than $60,000 to supply 1 kilowatt continuous by the method proposed therein. In addition to the favorable cost comparisons with conventional sources of energy, the present invention produces no pollutants and avoids consumption of limited natural resources. Although several embodiments have been shown and described, it will be obvious that other adaptations and modifications can be made without departing from the true spirit and scope of the invention.

What is claimed is:

1. Apparatus for generating electrical energy in a terrestrial environment comprising at least one photovoltaic cell, means for defining a liquid impervious closed chamber for containing said cell, said chamber defining means including a parabolic wall, said parabolic wall defining a solar energy pervious window therein, means for supporting said cell within said chamber adjacent to and spaced from said window by a distance, said parabolic wall having a reflective concave surface, means including said reflective concave surface for concentrating solar energy onto said cell through said window, a quantity of nonconductive liquid means substantially filling said chamber and surrounding said cell for absorbing heat energy therefrom, said quantity of said liquid energy absorbing means being sufficiently large to absorb and store heat energy from said photovoltaic cell to limit the temperature rise of said cell during the solar energy producing portion of a diurnal period, said distance being large enough to allow liquid circulation between said cell and said window and small enough to avoid substantial absorption of solar energy by the liquid means, the chamber defined by said chamber defining means having sufficient external surface area to afford transfer of heat from said liquid to the environment during the remainder of the diurnal period.

2. Apparatus according to claim 1 including first and second vessels, said first vessel being integral with said parabolic wall, said second vessel being remote from said parabolic wall, and means for establishing fluid communication between said vessels.

* * * * *